(12) United States Patent
Sun et al.

(10) Patent No.: US 11,133,213 B2
(45) Date of Patent: Sep. 28, 2021

(54) DEFLECTABLE PLATEN AND ASSOCIATED METHOD

(71) Applicant: APPLIED Materials, Inc., Santa Clara, CA (US)

(72) Inventors: Dawei Sun, Nashua, NH (US); Ming Yin, Gloucester, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 143 days.

(21) Appl. No.: 16/674,340

(22) Filed: Nov. 5, 2019

(65) Prior Publication Data
US 2021/0134650 A1    May 6, 2021

(51) Int. Cl.
| | | |
|---|---|---|
| *B32B 37/00* | (2006.01) | |
| *H01L 21/687* | (2006.01) | |
| *H01L 21/67* | (2006.01) | |
| *H01L 21/683* | (2006.01) | |

(52) U.S. Cl.
CPC .. *H01L 21/68714* (2013.01); *H01L 21/67288* (2013.01); *H01L 21/6833* (2013.01)

(58) Field of Classification Search
USPC .......................................................... 156/580
See application file for complete search history.

(56) References Cited

U.S. PATENT DOCUMENTS

| | | | |
|---|---|---|---|
| 6,190,488 B1 * | 2/2001 | Tada ....................... | B32B 37/10 156/228 |
| 6,623,563 B2 | 9/2003 | Hosokawa | |
| 7,597,776 B2 * | 10/2009 | Felk ................... | B29C 66/81261 156/583.1 |
| 9,281,252 B1 | 3/2016 | Würfel et al. | |
| 2016/0240423 A1 | 8/2016 | Matsunaga et al. | |

FOREIGN PATENT DOCUMENTS

| | | |
|---|---|---|
| JP | 2000-031253 A | 1/2000 |
| JP | 2019-057538 A | 4/2019 |

OTHER PUBLICATIONS

International Search Report dated Feb. 26, 2021, for the International Patent Application No. PCT/US2020/057234, filed on Oct. 24, 2020, 3 pages.
Written Opinion dated Feb. 26, 2021, for the International Patent Application No. PCT/US2020/057234, filed on Oct. 24, 2020, 5 pages.

* cited by examiner

*Primary Examiner* — James D Sells
(74) *Attorney, Agent, or Firm* — Kacvinsky Daisak Bluni PLLC

(57) ABSTRACT

A deflectable platen including an annular sidewall, a first layer coupled to the annular sidewall, the first layer having a first temperature control element associated therewith, a second layer coupled to the annular sidewall and disposed in a parallel, spaced-apart relationship with the first layer to define a gap therebetween, the second layer having a second temperature control element associated therewith, and a controller coupled to the first and second temperature control elements and configured to operate the first and second temperature control elements to vary temperatures of the first and second layers relative to one another to deflect the platen to more closely match a contour of a wafer.

20 Claims, 3 Drawing Sheets

(A-A FROM FIG 1A)

DEFLECTABLE PLATEN AND ASSOCIATED METHOD

FIELD OF THE DISCLOSURE

Embodiments of the present disclosure relate generally to the field of semiconductor device fabrication, and more particularly to a deflectable platen for facilitating effective clamping of semiconductor wafers.

BACKGROUND OF THE DISCLOSURE

Semiconductor wafers are typically disposed on flat platens during ion implantation and certain other processes performed during semiconductor device fabrication. Commonly, a semiconductor wafer is secured to a platen via electrostatic clamping, wherein an electrical voltage is applied between embedded electrodes in a platen and a resulting electric field holds a semiconductor wafer to the platen. Electrostatic clamping is preferable to mechanical clamping since mechanical clamping can damage and/or contaminate a semiconductor wafer.

The ability of a platen to securely clamp a semiconductor wafer thereto via electrostatic clamping largely depends on the proximity of the bottom surface of the semiconductor wafer to the top surface of the platen. Ideally, these surfaces are planar and are disposed in flat, continuous contact with one another. In some cases, a semiconductor wafer may be warped (e.g., deflected up to 20 thousandths of an inch (thou)), resulting in a relatively large gap between a bottom surface of the semiconductor wafer and a top surface of a platen. This may result in weak or ineffective electrostatic clamping. This problem can be exacerbated if the semiconductor wafer and the platen are exposed to high temperature or cryogenic processes (e.g., during high temperature or cryogenic ion implantation), wherein incoherent deflection of the semiconductor wafer and the platen may cause the gap therebetween to increase in size.

Thus, minimizing surface-to-surface proximity between a semiconductor wafer and a platen is desirable for facilitating secure electrostatic clamping therebetween. With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An exemplary embodiment of a deflectable platen in accordance with the present disclosure may include an annular sidewall, a first layer coupled to the annular sidewall, the first layer having a first temperature control element associated therewith, and a second layer coupled to the annular sidewall and disposed in a parallel, spaced-apart relationship with the first layer to define a gap therebetween, the second layer having a second temperature control element associated therewith.

Another exemplary embodiment of a deflectable platen in accordance with the present disclosure may include an annular sidewall, a first layer coupled to the annular sidewall, the first layer having a first temperature control element associated therewith, a second layer coupled to the annular sidewall and disposed in a parallel, spaced-apart relationship with the first layer to define a gap therebetween, the second layer having a second temperature control element associated therewith, and a controller coupled to the first and second temperature control elements and configured to operate the first and second temperature control elements to vary temperatures of the first and second layers relative to one another to deflect the platen to more closely match a contour of a wafer.

An exemplary embodiment of a method of deflecting a platen in accordance with the present disclosure may include providing an annular sidewall, providing a first layer coupled to the annular sidewall, the first layer having a first temperature control element associated therewith, providing a second layer coupled to the annular sidewall and disposed in a parallel, spaced-apart relationship with the first layer to define a gap therebetween, the second layer having a second temperature control element associated therewith, and varying a temperature of at least one of the first and second layers using the first and second temperature control elements.

BRIEF DESCRIPTION OF THE DRAWINGS

By way of example, various embodiments of the disclosed apparatus will now be described, with reference to the accompanying drawings, wherein.

DETAILED DESCRIPTION

Figure 1A:
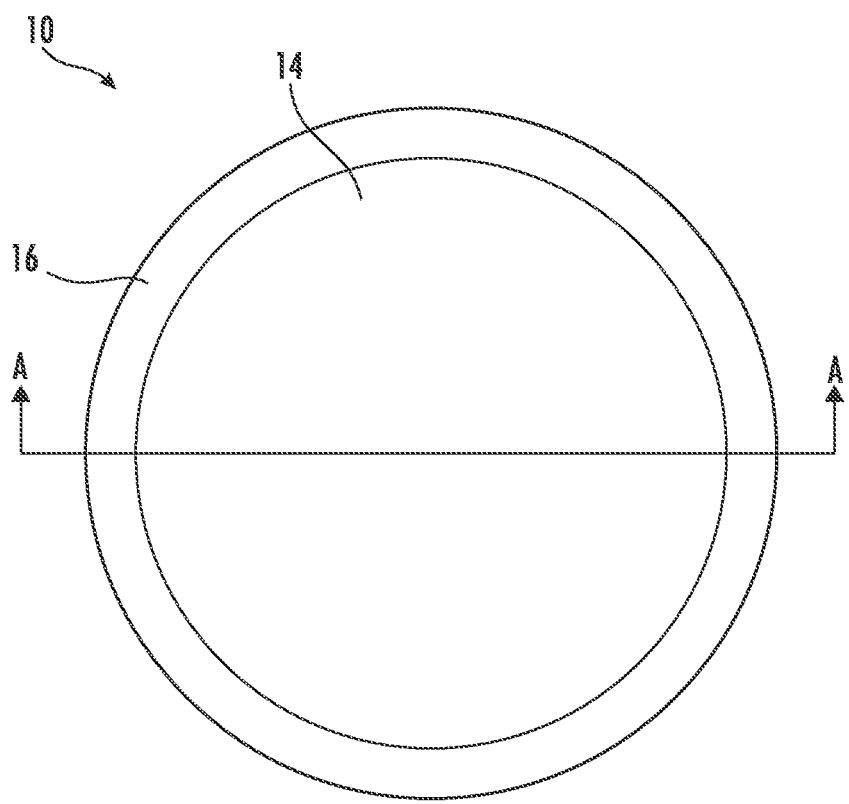
FIG. 1A is a top view illustrating an exemplary embodiment of a deflectable platen in accordance with the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Figure 1B:
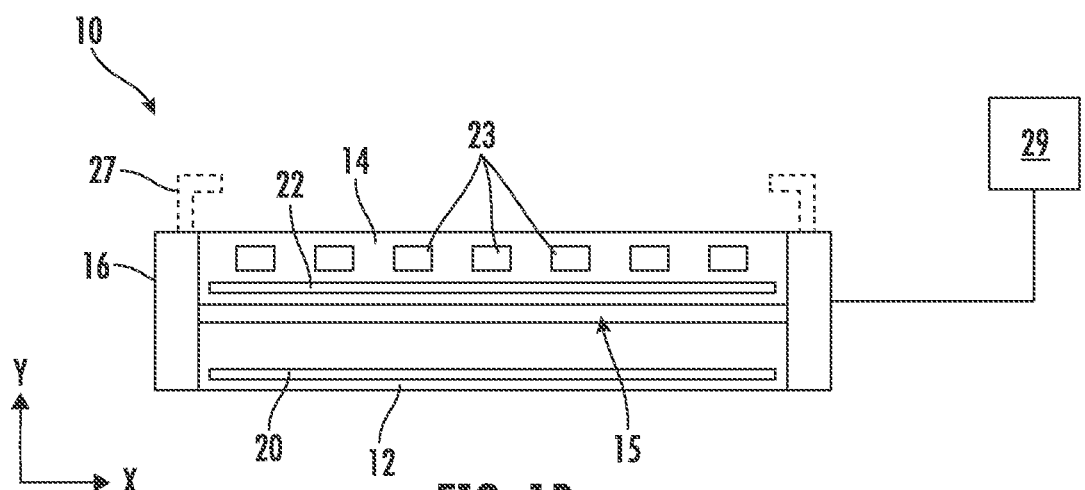
FIG. 1B is a cross sectional side view illustrating the deflectable platen of FIG. 1A.

Referring to FIGS. 1A and 1B, a top view and a cross-sectional side view illustrating a deflectable platen 10 (hereinafter "the platen 10") in accordance with an exemplary embodiment of the present disclosure are shown, respectively. The platen 10 may be elastically deformable (as further described below) for providing a close clearance relationship between a top surface of the platen 10 and a bottom surface of a warped or bowed semiconductor wafer disposed upon the platen 10 to facilitate effective clamping therebetween.

The platen 10 may include a generally planar first layer 12 and a generally planar second layer 14 disposed in a parallel, vertically spaced apart relationship (i.e., spaced apart from one other in a direction parallel to the Y-axis shown in FIG. 1B) to define a gap 15 therebetween. Circumferential edges of the first and second layers 12, 14 may be connected to an annular sidewall 16 surrounding the first and second layers 12, 14 as further described below. In various examples, the first and second layers 12, 14 may be formed of a material having a coefficient of thermal expansion (CTE) in a range between $6.0\times10^{-6}/°$ C. and $8.0\times10^{-6}/°$ C. In a specific example, the first and second layers 12, 14 may be formed of a ceramic, including, and not limited to, aluminum oxide, zirconia, or aluminum nitride. The present disclosure is not limited in this regard. The first and/or second layers 12, 14 may alternatively be formed of other relatively high or low CTE materials including, and not limited to, aluminum, silver, copper and their alloys, or quartz.

The sidewall 16 of the platen 10 may be formed of a dielectric material having a relatively low CTE or a CTE similar to the CTE of the material of the first and second layers 12, 14. In various examples, the sidewall 16 may be formed of a material having a CTE less than $6.0\times10^{-6}/°$ C. (e.g., between $2.0\times10^{-6}/°$ C. and $4.0\times10^{-6}/°$ C.). In a specific example, the sidewall 16 may be formed of a ceramic such as aluminum nitride or aluminum oxide. The present disclosure is not limited in this regard. The sidewall 16 may alternatively be formed of other dielectric materials, including, and not limited to, other ceramics and various composite materials. The sidewall 16 may be connected to the edges of the first and second layers 12, 14 by brazing, welding, thermally-resistant adhesives, various mechanical fasteners, glass bonding, and/or other techniques suitable for bonding or fastening the material of the sidewall 16 to the materials of the first and second layers 12, 14. As will be described in greater detail below, the sidewall 16 may mechanically translate expansion and contraction of the first and second layers 12, 14 to one another.

The first and second layers 12, 14 may include respective first and second heating elements 20, 22 associated therewith. For example, in the embodiment of the platen shown in FIG. 1B, the first and second heating elements 20, 22 may be embedded within the first and second layers 12, 14. The first and second heating elements 20, 22 may include one or more wires, cables, plates, tapes, etc. connected to one or more sources of electrical power (now shown). The first and second heating elements 20, 22 may be independently operable for selectively and independently heating the first and second layers 20, 22. In various examples, the first and second heating elements 20, 22 may heat the first and second layers 12, 14, respectively, to temperatures in excess of 800 degrees Celsius (e.g., in a range of 800 degrees Celsius to 1200 degrees Celsius). The present disclosure is not limited in this regard. The gap 15 separating the first and second layers 12, 14 may be held at or near vacuum and may thus provide thermal separation between the first and second layers 12, 14. Particularly, the gap 15 may prevent all or most of the heat generated by the first heating element 20 from being communicated to the second layer 14 and may prevent all or most of the heat generated by the second heating element 22 from being communicated to the first layer 12. In various embodiments, the platen 10 may additionally or alternatively include one or more layers of thermally insulating material disposed between the first and second layers 12, 14.

Figure 2A:
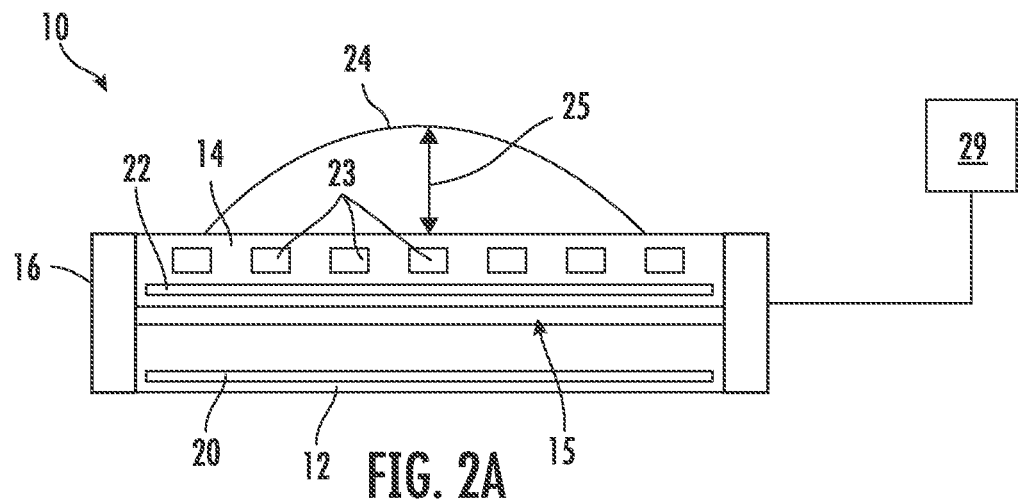
FIG. 2A is a cross sectional side view illustrating the deflectable platen of FIGS. 1A and 1B with a convex deflected semiconductor wafer disposed thereon.

The second layer 14 of the platen 10 may have a plurality of electrodes 23 associated therewith. For example, in the embodiment of the platen shown in FIG. 1B, the electrodes 23 may be embedded within the second layer 14. In various alternative embodiments of the platen 10, the electrodes 23 may be embedded within a separate layer of dielectric material disposed atop the second layer 14. The present disclosure is not limited in this regard. The electrodes 23 may be connected to a source of electrical power (not shown) and may be arranged and configured to operate in the manner of a conventional electrostatic clamp familiar to those of skill in the art. Particularly, by applying an electrical voltage across the electrodes 23, an electrical field can be generated and may hold a semiconductor wafer to the platen 10 via electrostatic force. The strength of the electrostatic force acting on the wafer will depend partly on the proximity of the wafer to the electrodes 23. Ideally, the contour of the bottom surface of the wafer will match or nearly match the contour of the top surface of the platen 10 (e.g., if these surfaces are planar or nearly planar), thus establishing a shortest possible distance between the electrodes 23 and the wafer to provide strong electrostatic coupling therebetween. In some cases, a wafer, such as the semiconductor wafer 24 (hereinafter "the wafer 24") shown in FIG. 2A, may be warped or bowed (e.g., deflected up to, and possibly greater than, 20 thou) and may present a concave bottom surface to the generally planar top surface of the platen 10 (the deflection of the wafer 24 as shown in FIG. 2A is exaggerated for purposes of illustration). The resulting gap 25 between the wafer 24 and the platen 10 may attenuate the electrostatic force acting on the wafer 24, thus resulting in poor electrostatic clamping between the platen 10 and the wafer 24.

In various alternative embodiments of the platen 10, the electrodes 23 may be omitted, and the wafer 24 may be secured to the top surface of the platen 10 using a mechanical clamp 27 (shown in dashed lines in FIG. 1B) of a variety familiar to those of ordinary skill in the art. As in the case of electrostatic coupling, the contour of the bottom surface of the wafer 24 will ideally match or nearly match the contour of the top surface of the platen 10 (e.g., if these surfaces are planar or nearly planar) to facilitate optimal contact and secure mechanical coupling therebetween, as well as to facilitate optimal thermal coupling between the platen 10 and the wafer 24. Good thermal coupling may be desirable if the platen 10 is configured to heat or cool wafers disposed thereon (e.g., heat transfer via inert gas introduced between the platen 10 and the wafer 24). If the wafer 24 is warped or bowed, the resulting gap 25 between the wafer 24 and the platen 10 may be detrimental to secure mechanical clamping and/or to establishing effective thermal coupling between the wafer 24 and the platen 10.

Figure 2B:
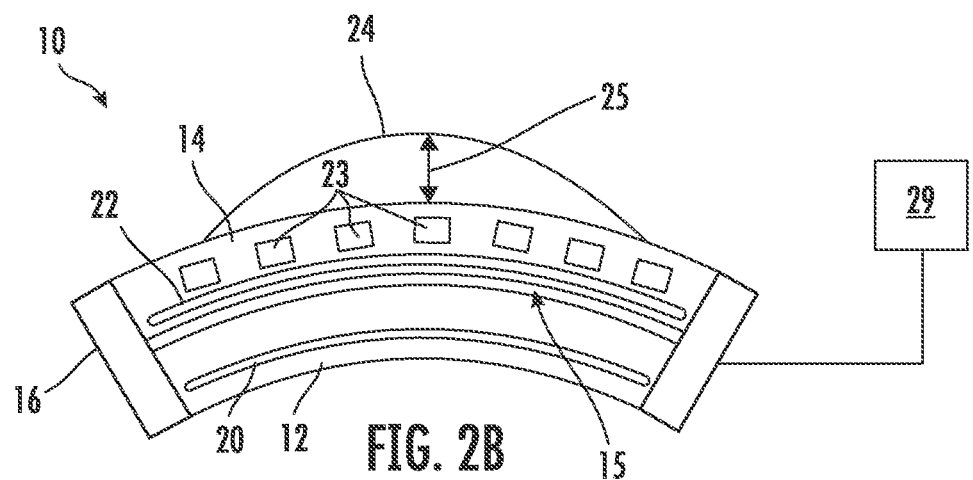
FIG. 2B is a cross sectional side view illustrating the deflectable platen of FIG. 2A in a convex deflected state.

Referring to FIG. 2B, the platen 10 is shown in a convex deflected state. Particularly, the second heating element 22 is activated, and the first heating element 20 is not activated or is activated at lower power, resulting in heating of the second layer 14 while the first layer 12 is unheated or is heated to a lower temperature than the second layer 14. When heated, the second layer 14 may exhibit thermal expansion in accordance with its CTE. Since the second layer 14 is connected to the first layer 12 by the sidewall 16, and since the unheated first layer 12 does not expand (or expands at a slower rate and/or to a lesser degree than the heated second layer 14), the expansion of the second layer 14 in the radial direction may cause the upper portion of the sidewall 16 to deflect outwardly, in-turn causing the edges of the first and second layers 12, 14 to be pulled or deflected downwardly, resulting in a convex deflection of the platen 10 as shown in FIG. 2B. Thus, the contour of the top surface of the platen 10 may be made to more closely match the contour of the bottom surface of the wafer 24 to reduce the size of the gap 25 therebetween relative to the undeflected state of the platen 10 shown in FIG. 2A. In the case of electrostatic clamping, the smaller gap 25 and closer proximity of the electrodes 23 to the wafer 24 facilitated by the deflected platen 10 provide a stronger electrostatic force acting on the wafer 24 relative to the electrostatic force applied by the undeflected platen 10 shown in FIG. 2A, thus resulting in better electrostatic coupling between the platen 10 and the wafer 24. In the case of mechanical clamping, the smaller gap 25 achieved by the deflected platen 10 facilitates more secure clamping of the wafer 24 to the platen 10 and better thermal coupling between the platen 10 and the wafer 24 relative to the undeflected platen 10 shown in FIG. 2A.

Figure 2C:
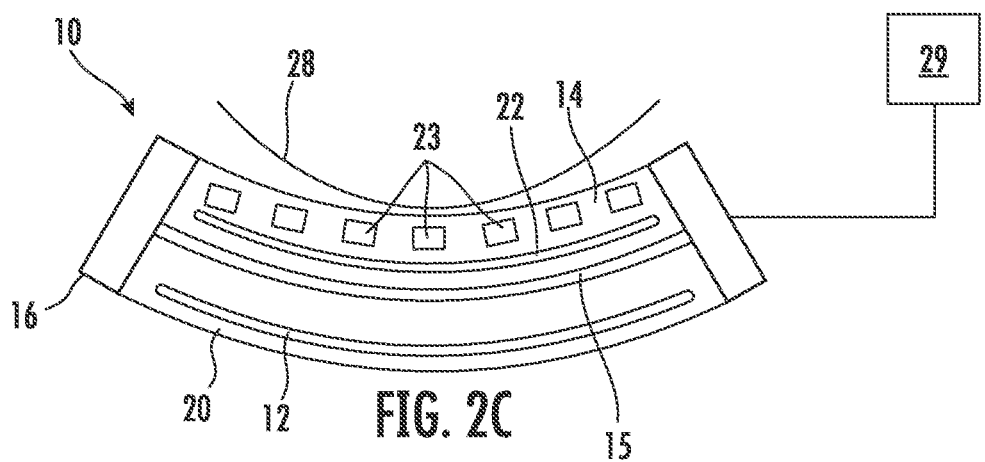
FIG. 2C is a cross sectional side view illustrating the deflectable platen of FIGS. 1A and 1B in a concave deflected state with a concave deflected semiconductor wafer disposed thereon.

The platen 10 may also be deflected in the concave direction to accommodate bowed or warped semiconductor wafers presenting a convex surface to the top surface of the platen 10. For example, referring to FIG. 2C, the platen 10 is shown in a concave deflected state with a concave deflected semiconductor wafer 28 (hereinafter "the wafer 28") disposed thereon. Particularly, the first heating element 20 is activated and the second heating element 22 is not activated (or active at a lower power), resulting in heating of the first layer 12 relative to the second layer 14. When heated, the first layer 12 may exhibit thermal expansion in accordance with its CTE. Since the first layer 12 is connected to the second layer 14 by the sidewall 16, and since the unheated second layer 14 does not expand (or expands at a slower rate and/or to a lesser degree than the heated first layer 12), the expansion of the first layer 12 in the radial direction may cause the lower portion of the sidewall 16 to deflect outwardly, in-turn causing the edges of the first and second layers 12, 14 to be pulled or deflected upwardly, resulting in a concave deflection of the platen 10 as shown in FIG. 2C. Thus, the contour of the top surface of the platen 10 may be made to more closely match the contour of the bottom surface of the wafer 28, thus resulting in better electrostatic or mechanical coupling between the platen 10 and the wafer 28 as described above.

In various examples, the first and second layers 12, 14 may be heated to temperatures between 300 degrees Celsius and 800 degrees Celsius to achieve a target amount of deflection. In particular non-limiting examples, the platen 10 may exhibit a convex deflection of 18 thou when the second layer is heated to a temperature of 500 degrees Celsius and may exhibit a convex deflection of 18 thou when the first layer is heated to a temperature of 500 degrees Celsius. The present disclosure is not limited in this regard. The degree of deflection in the platen 10 will depend on a number of factors, including, and not limited to, the CTEs of the first and second layers 12, 14, the amount of heat applied to the first and second layers 12, 14, the diameters of the first and second layers 12, 14, and the thicknesses of the first and second layers 12, 14.

In various embodiments, the deflection stress on the first and second layers 12, 14 during heating of either layer may be less than the yield strength of the materials of the first and second layers 12, 14. Thus, when the first and second layers 12, 14 are allowed to cool to room temperature, the platen 10 may return to its original, generally planar state as shown in FIG. 1B. Thus, by varying the amount of heat applied to the first and second layers 12, 14, the platen 10 may be controllably deflected to varying degrees (e.g., from 0 to 20 thou) in either direction (i.e., concave or convex) to match or approach the contours of wafers having various degrees of deflection disposed thereon to provide effective electrostatic or mechanical clamping therebetween. Accordingly, the deflection of an incoming wafer may be measured (e.g., via contact sensors, image analysis, etc.) and a controller 29 operatively coupled to the platen 10 may, upon receiving data representing the measured deflection of the wafer, dictate operation of the first and second heating elements 20, 22 to deflect the platen 10 to match or approach the contour of the incoming wafer.

While the platen 10 has been described above as including embedded first and second heating elements 20, 22 for controllably and selectively heating the first and second layers 12, 14, various alternative embodiments of the platen 10 are contemplated wherein the first and second heating elements 20, 22 described above and shown in the figures may instead be cooling elements for controllably and selectively cooling the first and second layers 12, 14. Thus, the first and second heating elements 20, 22 may alternatively be referred to herein as "cooling elements 20, 22" or, more generically, as "temperature control elements 20, 22." Cooling elements may be, or may include, various channels, conduits, tubes, pipes, ducts, etc. embedded in, disposed on, or extending through the first and second layers 12, 14 for circulating a cooling fluid (e.g., water, liquid nitrogen, etc.) therethrough. The cooling elements 20, 22 may be used to cool the first and/or the second layers 12, 14 to temperatures in a range between 0 degrees Celsius and −150 degrees Celsius, for example. By cooling one of the first and second layers 12, 14 and not cooling the other of the first and second layers 12, 14, the cooled layer may exhibit thermal contraction in accordance with its CTE. Since the first and second layers 12, 14 are connected to one another by the sidewall 16, and since the uncooled layer does not contract (or contracts at a slower rate and/or to a lesser degree than the cooled layer), the contraction of the cooled layer in the radial direction may cause the sidewall 16 to be deflected, in-turn causing the edges of the first and second layers 12, 14 to be pulled or deflected upwardly or downwardly depending on the layer being cooled, resulting in a concave or convex deflection of the platen 10 as shown in FIGS. 2B and 2C. In various other embodiments, the first and second layers 12, 14 may include heating elements and cooling elements like those described above.

Figure 3:
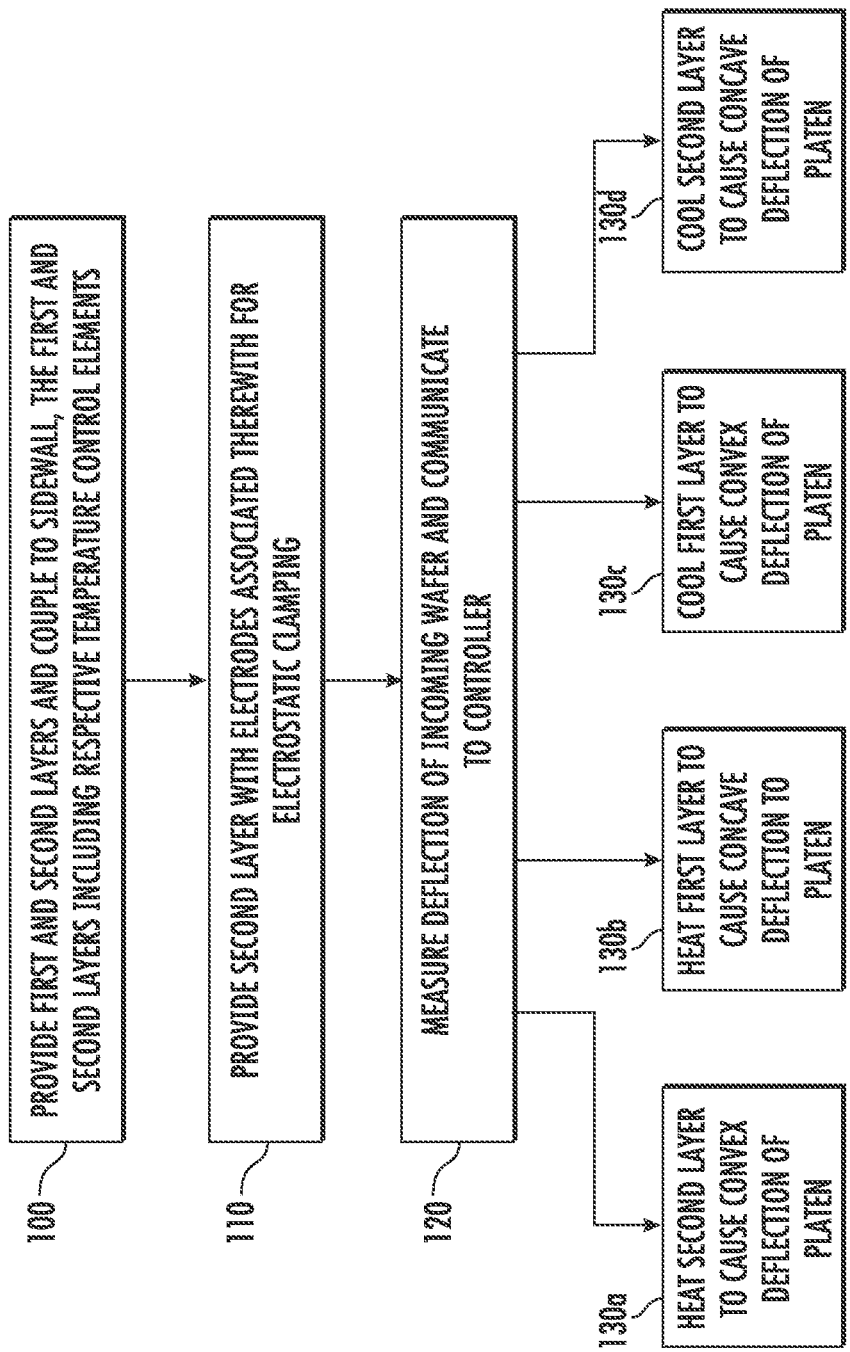
FIG. 3 is a flow diagram illustrating an exemplary embodiment of a method for deflecting a platen in accordance with the present disclosure.

Referring to FIG. 3, a flow diagram illustrating an exemplary method for deflecting a platen in accordance with the present disclosure is shown. The method will now be described in conjunction with the illustrations of the platen 10 shown in FIGS. 1A-2C.

At block 100 of the exemplary method, the first layer 12 and the second layer 14 may be provided and may be coupled to the annular sidewall 16, such as by brazing, welding, thermally-resistant adhesives, various mechanical fasteners, glass bonding, and/or other techniques suitable for bonding or fastening the material of the sidewall 16 to the materials of the first and second layers 12, 14. The first layer 12 and the second layer 14 may be disposed in a parallel, spaced-apart relationship defining the gap 15 therebetween, and the gap 15 may be held at or near vacuum to provide thermal insulation between the first and second layers 12, 14. The first and second layers 12, 14 may include respective first and second temperature control elements 20, 22 associated therewith (e.g., embedded therein). At block 110 of the exemplary method, the second layer 14 may be provided with the electrodes 23 associated therewith (e.g., embedded therein) for facilitating electrostatic clamping of wafers to the platen 10. In various alternative embodiments the electrodes 23 may be omitted and the mechanical clamp 27 may be implemented.

At block 120 of the exemplary method, the deflection of an incoming wafer may be measured (e.g., via contact sensors, imaging, etc.) and the controller 29 operatively coupled to the platen 10 may, upon receiving data representing the measured deflection of the wafer, dictate operation of the first and second temperature control elements 20, 22 to deflect the platen 10 to match or approach the contour of the incoming wafer. In one example, wherein the first and second temperature control elements 20, 22 are heating elements, the second temperature control element 22 may, at block 130a of the exemplary method, be activated to heat the second layer 14 relative to the first layer 12. When heated, the second layer 14 may exhibit thermal expansion in accordance with its CTE. Since the second layer 14 is connected to the first layer 12 by the sidewall 16, and since the unheated first layer 12 does not expand (or expands at a slower rate and/or to a lesser degree than the heated second layer 14), the expansion of the second layer 14 in the radial direction may cause the upper portion of the sidewall 16 to deflect outwardly, in-turn causing the edges of the first and second layers 12, 14 to be pulled or deflected downwardly, resulting in a convex deflection of the platen 10 as shown in FIG. 2B. Thus, the contour of the top surface of the platen 10 may be made to more closely match the contour of the bottom surface of the incoming wafer.

In another example, wherein the first and second temperature control elements 20, 22 are heating elements, the first temperature control element 20 may, at block 130b of the exemplary method, be activated to heat the first layer 12 relative to the second layer 14. When heated, the first layer 12 may exhibit thermal expansion in accordance with its CTE. Since the first layer 12 is connected to the second layer 14 by the sidewall 16, and since the unheated second layer 14 does not expand (or expands at a slower rate and/or to a lesser degree than the first layer 12), the expansion of the first layer 12 in the radial direction may cause the lower portion of the sidewall 16 to deflect outwardly, in-turn causing the edges of the first and second layers 12, 14 to be pulled or deflected upwardly, resulting in a concave deflection of the platen 10 as shown in FIG. 2C. Thus, the contour of the top surface of the platen 10 may be made to more closely match the contour of the incoming wafer.

In another example, wherein the first and second temperature control elements 20, 22 are cooling elements, the first temperature control element 20 may, at block 130c of the exemplary method, be activated to cool the first layer 12 relative to the second layer 14. When cooled, the first layer 12 may exhibit thermal contraction in accordance with its CTE. Since the first layer 12 is connected to the second layer 14 by the sidewall 16, and since the uncooled second layer 14 does not contract (or contacts at a slower rate and/or to a lesser degree than the first layer 12), the contraction of the first layer 12 in the radial direction may cause the lower portion of the sidewall 16 to deflect inwardly, in-turn causing the edges of the first and second layers 12, 14 to be pulled or deflected downwardly, resulting in a convex deflection of the platen 10 as shown in FIG. 2B. Thus, the contour of the top surface of the platen 10 may be made to more closely match the contour of the incoming wafer.

In another example, wherein the first and second temperature control elements 20, 22 are cooling elements, the second temperature control element 22 may, at block 130d of the exemplary method, be activated to cool the second layer 14 relative to the first layer 12. When cooled, the second layer 14 may exhibit thermal contraction in accordance with its CTE. Since the second layer 14 is connected to the first layer 12 by the sidewall 16, and since the uncooled first layer 12 does no contract (or contracts at a slower rate and/or to a lesser degree than the cooled second layer 14), the contraction of the second layer 14 in the radial direction may cause the upper portion of the sidewall 16 to deflect inwardly, in-turn causing the edges of the first and second layers 12, 14 to be pulled or deflected upwardly, resulting in a concave deflection of the platen 10 as shown in FIG. 2C. Thus, the contour of the top surface of the platen 10 may be made to more closely match the contour of the bottom surface of the incoming wafer.

As will be appreciated by those of ordinary skill in the art, the above-described deflectable platen 10 provides distinct advantages relative to conventional platens. For example, the platen 10 can be selectively and dynamically deflected through the controlled application of heat (or cooling) to the first and second layers 12, 14 to rapidly and conveniently facilitate effective clamping with wafers having various degrees of concave or convex deflection. Furthermore, the ability of the platen 10 conform to the contour of a wafer disposed thereon facilities effective thermal communication between the platen 10 and the wafer (e.g., for heating and/or cooling the wafer).

The present disclosure is, not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A deflectable platen comprising:
an annular sidewall;
a first layer coupled to the annular sidewall, the first layer having a first temperature control element associated therewith; and
a second layer coupled to the annular sidewall and disposed in a parallel, spaced-apart relationship with the first layer to define a gap therebetween, the second layer having a second temperature control element associated therewith.

2. The deflectable platen of claim 1, further comprising a plurality of electrodes associated with the second layer for facilitating electrostatic clamping of wafers to the deflectable platen.

3. The deflectable platen of claim 1, wherein the first and second temperature control elements are first and second heating elements.

4. The deflectable platen of claim 3, wherein the first and second heating elements include one or more of wires, cables, plates, and tapes connected to one or more electrical power sources.

5. The deflectable platen of claim 3, wherein the first and second heating elements are independently controllable for independently heating the first and second layers to temperatures in excess of 800 degrees Celsius.

6. The deflectable platen of claim 1, wherein the first and second temperature control elements are first and second cooling elements.

7. The deflectable platen of claim 6, wherein the first and second cooling elements include one or more of channels, conduits, tubes, pipes, and ducts for circulating a cooling fluid.

8. The deflectable platen of claim 6, wherein the first and second cooling elements are independently controllable for independently cooling the first and second layers to temperatures in a range of 0 degrees Celsius to −150 degrees Celsius.

9. The deflectable platen of claim 1, wherein the first and second layers are formed of a material having a coefficient of thermal expansion in a range between $6.0\times10-6/^\circ$ C. and $8.0\times10-6/^\circ$ C.

10. The deflectable platen of claim 1, wherein the sidewall is formed of a material having a coefficient of thermal expansion less than $6.0\times10-6/^\circ$ C.

11. The deflectable platen of claim 1, wherein the gap is at vacuum and provides thermal insulation between the first and second layers.

12. A deflectable platen comprising:
an annular sidewall;
a first layer coupled to the annular sidewall, the first layer having a first temperature control element associated therewith;
a second layer coupled to the annular sidewall and disposed in a parallel, spaced-apart relationship with the first layer to define a gap therebetween, the second layer having a second temperature control element associated therewith; and
a controller coupled to the first and second temperature control elements and configured to operate the first and second temperature control elements to vary temperatures of the first and second layers relative to one another to deflect the deflectable platen to more closely match a contour of a wafer.

13. A method of deflecting a platen comprising:
providing an annular sidewall;
providing a first layer coupled to the annular sidewall, the first layer having a first temperature control element associated therewith;
providing a second layer coupled to the annular sidewall and disposed in a parallel, spaced-apart relationship with the first layer to define a gap therebetween, the second layer having a second temperature control element associated therewith; and
varying a temperature of at least one of the first and second layers using the first and second temperature control elements.

14. The method of claim 13, further comprising providing the second layer with electrodes associated therewith for facilitating electrostatic clamping of wafers to the platen.

15. The method of claim 13, wherein the first and second temperature control elements are first and second heating elements, the method further comprising activating the second heating element to heat the second layer relative to the first layer, resulting in thermal expansion of the second layer and convex deflection of the platen.

16. The method of claim 13, wherein the first and second temperature control elements are first and second heating elements, the method further comprising activating the first heating element to heat the first layer relative to the second layer, resulting in thermal expansion of the first layer and concave deflection of the platen.

17. The method of claim 13, wherein the first and second temperature control elements are first and second cooling elements, the method further comprising activating the second cooling element to cool the second layer relative to the first layer, resulting in thermal contraction of the second layer and concave deflection of the platen.

18. The method of claim 13, wherein the first and second temperature control elements are first and second cooling elements, the method further comprising activating the first cooling element to cool the first layer relative to the second layer, resulting in thermal contraction of the first layer and convex deflection of the platen.

19. The method of claim 13, further comprising:
measuring a deflection of a wafer to be disposed on the platen;
communicating data representing the measured deflection of the wafer to a controller operatively connected to the first and second temperature control elements; and
activating, via the controller, at least one of the first and second temperature control elements to vary temperatures of the first and second layers to deflect the platen to more closely match a contour of the wafer.

20. The method of claim 19, wherein the deflection of the wafer is measured using one of contact sensors and image analysis.

* * * * *